(12) United States Patent
Xie et al.

(10) Patent No.: US 9,398,685 B2
(45) Date of Patent: Jul. 19, 2016

(54) FLEXIBLE DEVICE CARRIER AND METHOD FOR ATTACHING MEMBRANE ON FLEXIBLE DEVICE

(71) Applicant: BOE TECHNOLOGY GROUP CO., LTD., Beijing (CN)

(72) Inventors: Mingzhe Xie, Beijing (CN); Chunyan Xie, Beijing (CN); Lu Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 62 days.

(21) Appl. No.: 14/415,637

(22) PCT Filed: May 22, 2014

(86) PCT No.: PCT/CN2014/078072
§ 371 (c)(1),
(2) Date: Jan. 19, 2015

(87) PCT Pub. No.: WO2015/109696
PCT Pub. Date: Jul. 30, 2015

(65) Prior Publication Data
US 2016/0021733 A1    Jan. 21, 2016

(30) Foreign Application Priority Data

Jan. 24, 2014    (CN) .......................... 2014 1 0036350

(51) Int. Cl.
*H05K 7/20*        (2006.01)
*H05K 1/02*        (2006.01)
(Continued)

(52) U.S. Cl.
CPC ................ *H05K 1/028* (2013.01); *H05K 3/281* (2013.01); *H05K 3/301* (2013.01); *H05K 2201/10128* (2013.01); *H05K 2201/2027* (2013.01); *H05K 2203/085* (2013.01)

(58) Field of Classification Search
None
See application file for complete search history.

(56) References Cited

U.S. PATENT DOCUMENTS

2003/0134450 A1*    7/2003    Lee .......................... H01L 23/13
                                                            438/106

FOREIGN PATENT DOCUMENTS

CN        102259459 A        11/2011
CN        202754196 U        2/2013
(Continued)

OTHER PUBLICATIONS

Search Report issued in International Application No. PCT/CN2014/078072, thirteen (13) pages.
(Continued)

*Primary Examiner* — Anthony Q Edwards
(74) *Attorney, Agent, or Firm* — Nath, Goldberg & Meyer; Joshua B. Goldberg

(57) ABSTRACT

The present invention provides a flexible device carrier for a flexible display panel and a method for attaching a membrane on the flexible device. The flexible device carrier comprises: a bottom plate; a position-limiting plate provided opposite to the bottom plate and detachably mounted on the bottom plate through a position-limiting mechanism, wherein a slotted hole is provided on the position-limiting plate to match with one side of the bottom plate facing the position-limiting plate, so as to form a positioning groove for the flexible device. By using the flexible device carrier, the membrane can be tightly attached on the side of the flexible device away from the bottom plate of the flexible device carrier, reducing probability of defects such as occurrence of bubbles between the membrane and the flexible device, improving quality of attaching the membrane on the flexible device and improving product yield of the flexible display panel.

20 Claims, 3 Drawing Sheets

(51) Int. Cl.
*H05K 3/28* (2006.01)
*H05K 3/30* (2006.01)

(56) References Cited

FOREIGN PATENT DOCUMENTS

| | | |
|---|---|---|
| CN | 202841716 U | 3/2013 |
| CN | 202911978 U | 5/2013 |
| CN | 103129767 A | 6/2013 |
| CN | 203032057 U | 7/2013 |
| CN | 203164458 U | 8/2013 |
| CN | 203210810 U | 9/2013 |
| CN | 203225185 U | 10/2013 |
| CN | 203352956 U | 12/2013 |
| CN | 103770969 A | 5/2014 |
| CN | 203698721 U | 7/2014 |
| EP | 2 455 810 A2 | 5/2012 |
| TW | 201327691 A | 7/2013 |

OTHER PUBLICATIONS

Chinese Office Action dated Apr. 3, 2015 issued in corresponding Chinese Application No. 201410036350.3.
English translation of the Written Opinion of the International Searching Authority dated Sep. 26, 2014 issued in International Application No. PCT/CN2014/078072.

* cited by examiner

FLEXIBLE DEVICE CARRIER AND METHOD FOR ATTACHING MEMBRANE ON FLEXIBLE DEVICE

This is a National Phase Application filed under 35 U.S.C. 371 as a national stage of PCT/CN2014/078072, filed May 22, 2014, and claims priority benefit from Chinese Application No. 201410036350.3, filed Jan. 24, 2014, the content of each of which is hereby incorporated by reference in its entirety.

TECHNICAL FIELD

The present invention relates to the field of fabrication technology of flexible display panel, in particular, relates to a flexible device carrier and a method for attaching a membrane on the flexible device.

BACKGROUND ART

FIG. 1a shows a schematic view of cross sectional structure of a flexible device carrier used in a flexible display panel of prior art. As shown in FIG. 1a, currently, in the field of fabrication technology of flexible display panel, a carrier for supporting a flexible device comprises a body 01, and a positioning groove 011 is provided on the body 01 for supporting the flexible device.

As shown in FIGS. 1b to 1d, in a fabrication procedure of a flexible display panel, a flexible device 03 of the flexible display panel is fabricated on a rigid substrate base 02. As shown in FIG. 1b, the substrate base 02 and the flexible device 03 fabricated on the substrate base 02 are placed in the positioning groove 001 of the body 01 together, and the flexible device 03 is positioned between the substrate base 02 and a bottom of the positioning groove 011. The flexible device 03 and the substrate base 02 are fixed by the positioning groove 011. As shown in FIG. 1c, the flexible device 03 may be separated from the substrate base 02 by a laser removing process, and then the substrate base 02 may be removed. As shown in FIG. 1d, in order to form a flexible display panel, a membrane 04 is attached on one side of the flexible device 03 away from the bottom of the positioning groove 011 by an apparatus such as a roller 05 or the like.

However, since the flexible device 03 has a thickness smaller than a depth of the positioning groove 011 in the body 01, while attaching the membrane on the flexible device 03, there may be a gap between the membrane 04 and the flexible device 03, resulting in that, after the membrane 04 and the flexible device 03 are attached together, there may be defects such as bubbles or the like between the membrane 04 and the flexible device 03, thus product yield of the flexible display panel is lowered.

SUMMARY

An object of the present invention is to provide a flexible device carrier for a flexible display panel and a method for attaching a membrane on a flexible device, which can improve yield of attaching the membrane on the flexible device and can improve product yield of the flexible display panel.

In order to achieve the above object, the present invention provides the following technical solutions.

A flexible device carrier for a flexible display panel, comprising: a bottom plate; a position-limiting plate provided opposite to the bottom plate and detachably mounted on the bottom plate through a position-limiting mechanism, wherein a slotted hole is provided on the position-limiting plate to match with one side of the bottom plate facing the position-limiting plate, so as to form a positioning groove for the flexible device.

In the flexible device carrier, the bottom plate and the position-limiting plate are detachably mounted together, and after the bottom plate and the position-limiting plate are mounted together, the positioning groove for positioning the flexible device and the substrate base is formed by matching the slotted hole provided on the position-limiting plate with one side of the bottom plate facing the position-limiting plate. When a membrane is to be attached on the flexible device, the substrate base and the flexible device are separated from each other by a corresponding process, and the substrate base is removed. Then, the position-limiting plate is detached from the bottom plate so that the flexible device is directly placed on a surface of the bottom plate. Subsequently, the membrane is attached on one side of the flexible device away from the bottom plate of the flexible device carrier by for example a roller and the like. With the flexible device carrier, while attaching the membrane on the flexible device, the membrane can be tightly attached on the side of the flexible device away from the bottom plate of the flexible device carrier, thus reducing probability of defects such as occurrence of bubbles between the membrane and the flexible device.

Therefore, the flexible device carrier of the present invention can improve quality of attaching the membrane on the flexible device and further improve product yield of the flexible display panel.

Preferably, a vacuum suction hole is provided at a position on the bottom plate opposite to each the slotted hole.

Preferably, the vacuum suction hole is a circular hole, and the circular hole has a diameter equal to or smaller than 1 mm.

Preferably, the position-limiting mechanism comprises: a slot provided on the bottom plate and a plug provided on the position-limiting plate, the plug is plugged in and matches with the slot; and/or, a slot provided on the position-limiting plate and a plug provided on the bottom plate, the plug is plugged in and matches with the slot.

Preferably, four pairs of slots and plugs are provided, and the connection lines between center points of projections of the four pairs of slots and plugs on the side of the bottom plate facing the position-limiting plate constitute a quadrilateral.

Preferably, the position-limiting mechanism comprises: a fastener provided on the bottom plate and a hook provided on the position-limiting plate, the fastener is clamped in and matches with the hook; and/or, a hook provided on the bottom plate and a fastener provided on the position-limiting plate, the fastener is clamped in and matches with the hook.

Preferably, both of the bottom plate and the position-limiting plate are of a quadrilateral shape, and at least one pair of sides of the bottom plate and the position-limiting plate are provided with the fastener and/or the hook thereon.

Preferably, the position-limiting mechanism is of a mortise and tenon structure.

In another aspect, the present invention further provides a method for attaching a membrane on a flexible device supported by the flexible device carrier provided by any technical solution said above, comprising: separating and removing the substrate base attached on the side of the flexible device away from the bottom plate of the flexible device carrier; detaching the position-limiting plate from the bottom plate of the flexible device carrier; attaching the membrane on the side of the flexible device away from the bottom of the flexible device carrier.

With the method to attach the membrane on the flexible device, after detaching the position-limiting plate from the bottom plate of the flexible device carrier, the flexible device protrudes from the bottom plate, and the membrane can be directly attached on the side of the flexible device away from the bottom of the flexible device carrier, defects such as bubbles between the membrane and the flexible device due to the gap therebetween after attaching the membrane on the flexible device is reduced, and product yield of the flexible display panel is improved.

Preferably, the step of attaching the membrane on the side of the flexible device away from the flexible device carrier comprises: attaching the membrane on the side of the flexible device away from the flexible device carrier by a roller pressure process.

BRIEF DESCRIPTION OF THE DRAWINGS

FIG. 1b shows a schematic view of cross sectional structure formed after a flexible device and a substrate base are placed in positioning grooves of the flexible device carrier of FIG. 1a.

DETAILED DESCRIPTION OF THE PREFERRED EMBODIMENTS

Technical solutions of the present invention will be described clearly and completely below with reference to drawings of embodiments of the present invention. Obviously, the described embodiments only include a part of embodiments of the present invention rather than all of embodiments of the present invention. On a basis of the described embodiments of the present invention, various embodiments obtained by a person skilled in the art without any creative work belong to the protection scope of the present invention.

Figure 1A:
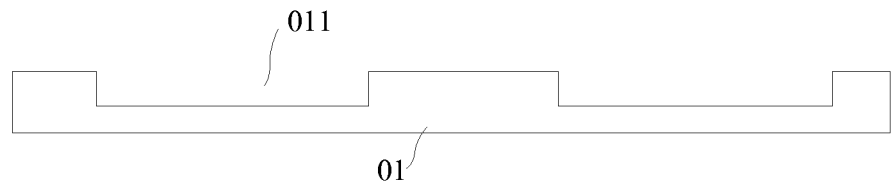
FIG. 1a shows a schematic view of cross sectional structure of a flexible device carrier used in a flexible display panel of prior art.
Figure 1B:
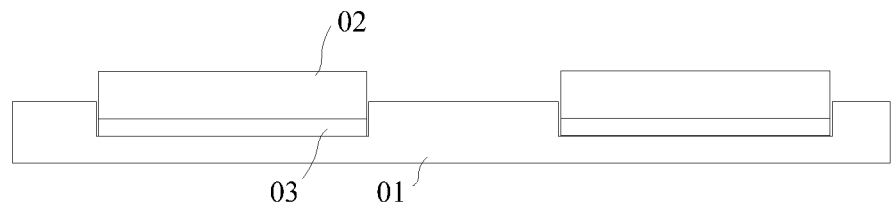
Figure 1C:
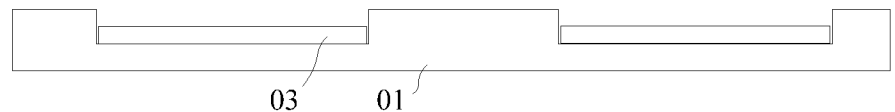
FIG. 1c shows a schematic view of cross sectional structure formed after the substrate base and the flexible device in FIG. 1b are separated from each other and the substrate base is removed in the prior art.
Figure 1D:
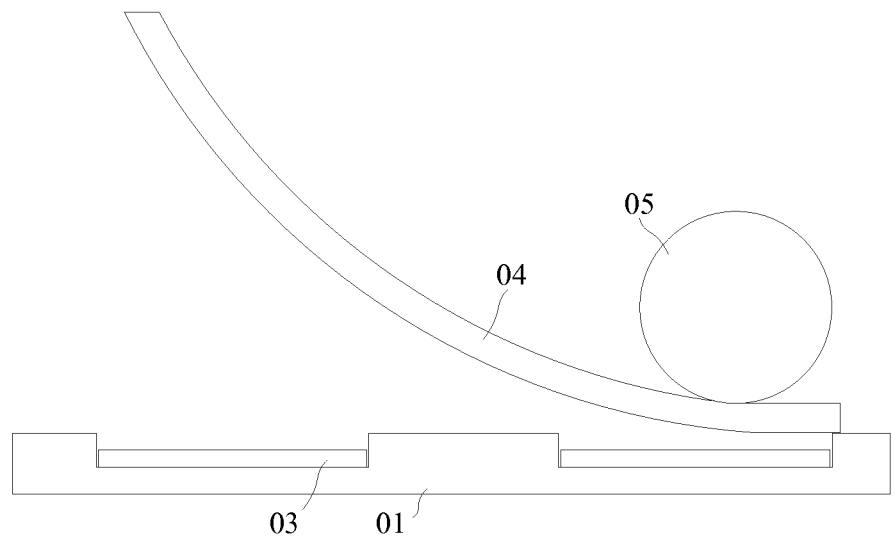
FIG. 1d shows a schematic view of cross section of a principle structure for attaching a membrane on the flexile device in FIG. 1c in the prior art.
Figure 2:
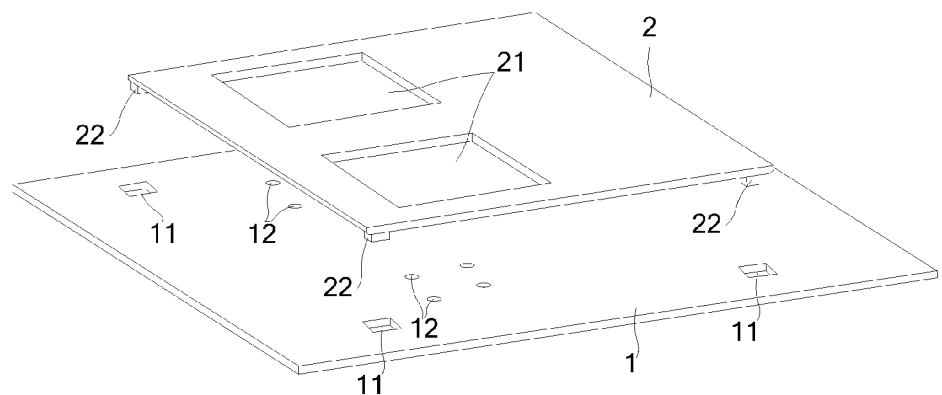
FIG. 2 shows a schematic structural view when the position-limiting plate and the bottom plate in a flexible device carrier of an embodiment of the present invention are separated from each other.
Figure 3:
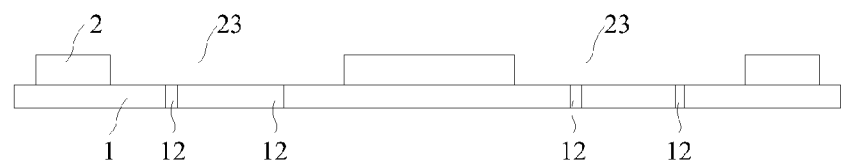
FIG. 3 shows a schematic view of cross sectional structure formed after the position-limiting plate and the bottom plate in a flexible device carrier of an embodiment of the present invention are assembled together.

With reference to FIGS. 2 and 3, the flexible device carrier provided by the present invention comprises: a bottom plate 1; a position-limiting plate 2 provided opposite to the bottom plate 1 and detachably mounted on the bottom plate 1 through a position-limiting mechanism, wherein slotted holes 21 are provided on the position-limiting plate 2 to match with one side of the bottom plate 1 facing the position-limiting plate 2, so as to form a positioning groove 23 for the flexible device.

Figure 4A:
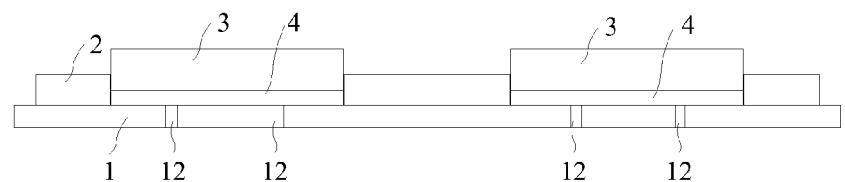
FIG. 4a shows a schematic view of cross sectional structure formed after a flexible device and a substrate base are placed in positioning grooves of the flexible device carrier in FIG. 3.
Figure 4B:
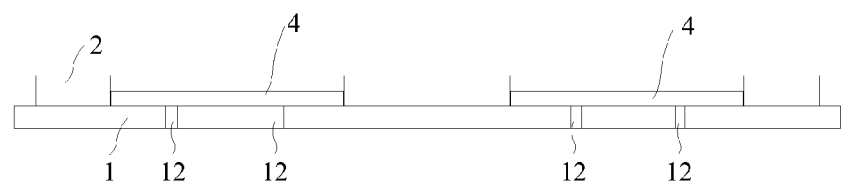
FIG. 4b shows a schematic view of cross sectional structure formed after the substrate base and the flexible device in FIG. 4a are separated from each other and the substrate base is removed.
Figure 4C:
FIG. 4c shows a schematic view of cross sectional structure formed after the position-limiting plate in FIG. 4b is removed.
Figure 4D:
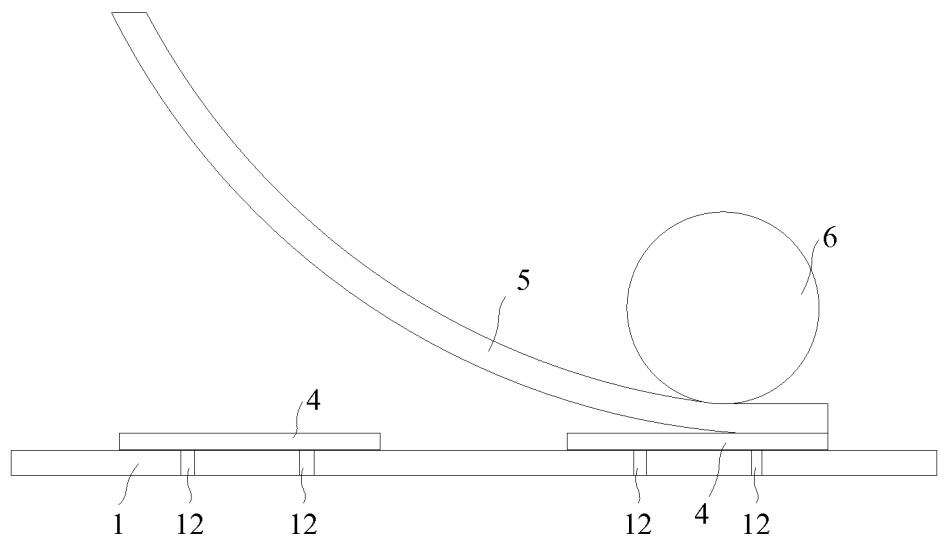
FIG. 4d shows a schematic view of cross section of a principle structure for attaching a membrane on the flexile device in FIG. 4c in the prior art.

As shown in FIGS. 4a to 4d, in the flexible device carrier, the bottom plate 1 and the position-limiting plate 2 are detachably mounted together, and after the bottom plate 1 and the position-limiting plate 2 are mounted together, the positioning groove 23 for positioning the flexible device 4 and the substrate base 3 is formed by matching the slotted holes 21 provided on the position-limiting plate 2 with the side of the bottom plate 1 facing the position-limiting plate 2. The flexible device 4 and the substrate base 3 are placed in the positioning groove 23, and the flexible device 4 is located between the substrate base 3 and the bottom plate 1, as shown in FIG. 4a. When a membrane is to be attached on the flexible device 4, the substrate base 3 and the flexible device 4 are separated from each other by a corresponding process, and the substrate base 3 is removed, as shown in FIG. 4b. Then, the position-limiting plate 2 is detached from the bottom plate 1 so that the flexible device 4 is directly placed on a surface of the bottom plate 1, as shown in FIG. 4c. The membrane 5 may be attached on the side of the flexible device 4 away from the bottom plate 1 by a roller 6 or the like, as shown in FIG. 4d. With the said flexible device carrier, while attaching the membrane on the flexible device 5, the membrane 5 can be tightly attached on the side of the flexible device 4 away from the bottom plate 1, thus reducing probability of defects such as occurrence of bubbles between the membrane 5 and the flexible device 4.

Therefore, the flexible device carrier of the present invention can improve quality of attaching the membrane on the flexible device and further improve product yield of the flexible display panel.

As shown in FIGS. 2 and 3, in a preferred implementation, a vacuum suction hole 12 is provided at a position on the bottom plate 1 opposite to each slotted hole 21. The flexible device 4 may be hold by a vacuum mechanism through the vacuum hole 12, improving positioning stability of the flexible device 4 on the bottom plate 1, and improving accuracy of attaching the membrane 5 on the flexible device 4.

Preferably, a plurality of vacuum holes 12 are provided at the position on the bottom plate 1 opposite to each slotted hole 21, and each vacuum hole 12 penetrates through the thickness of the bottom plate 1.

Further preferably, the vacuum suction hole 12 is a circular hole, and the circular hole 12 has a diameter equal to or smaller than 1 mm.

On a basis of implementations said above, the position-limiting mechanism between the position-limiting plate 2 and the bottom plate 1 may be of any of following modes.

As a first mode, the position-limiting mechanism between the position-limiting plate 2 and the bottom plate 1 may comprise a plug and a slot which are plugged with each other. Specifically, as shown in FIG. 2, a slot 11 is provided on the bottom plate 1 and a plug 22 is provided on the position-limiting plate 2, or a plug is provided on the bottom plate 1 and a slot is provided on the position-limiting plate 2 (not shown in the figures.), or a plug and a slot are provided on the bottom plate 1, and a slot plugged with the plug on the bottom plate 1 and a plug plugged with the slot on the bottom plate 1 are provided on the position-limiting plate 2 (not shown in FIGS.).

That is, the bottom plate 1 and the position-limiting plate 2 may be detachably assembled together by plugging the plug and the slot with each other, and a position limitation in a direction perpendicular to a direction of depth of the positioning groove 23 between the position-limiting plate 2 and the bottom plate 1.

On a basis of the first mode, preferably, the position-limiting mechanism comprises four pairs of slots and plugs, and the connection lines between center points of projections of the four pairs of slots and plugs on the side of the bottom plate 1 facing the position-limiting plate 2 constitute a quadrilateral.

As a second mode, the position-limiting mechanism between the position-limiting plate 2 and the bottom plate 1 may comprise a fastener and a hook clamping the fastener. Specifically, a fastener is provided on the bottom plate 1 and a hook is provided on the position-limiting plate 2, or a hook is provided on the bottom plate 1 and a fastener is provided on the position-limiting plate 2, or a fastener and a hook are provided on the bottom plate 1 and a hook clamping the fastener on the bottom plate 1 and a fastener clamped by the hook on the bottom plate 1 are provided on the position-limiting plate 2.

That is, the bottom plate 1 and the position-limiting plate 2 are detachably assembled together by clamping the fastener in the hook.

On a basis of the second mode, preferably, both of the bottom plate 1 and the position-limiting plate 2 are of a quadrilateral shape, and at least one pair of sides of the bottom plate 1 and the position-limiting plate 2 are provided with the fastener and/or the hook thereon.

As a third mode, the position-limiting mechanism between the bottom plate 1 and the position-limiting plate 2 may be of a mortise and tenon structure.

Of course, there may be other modes for the position-limiting mechanism between the bottom plate 1 and the position-limiting plate 2, which will not be enumerated here.

Figure 5:
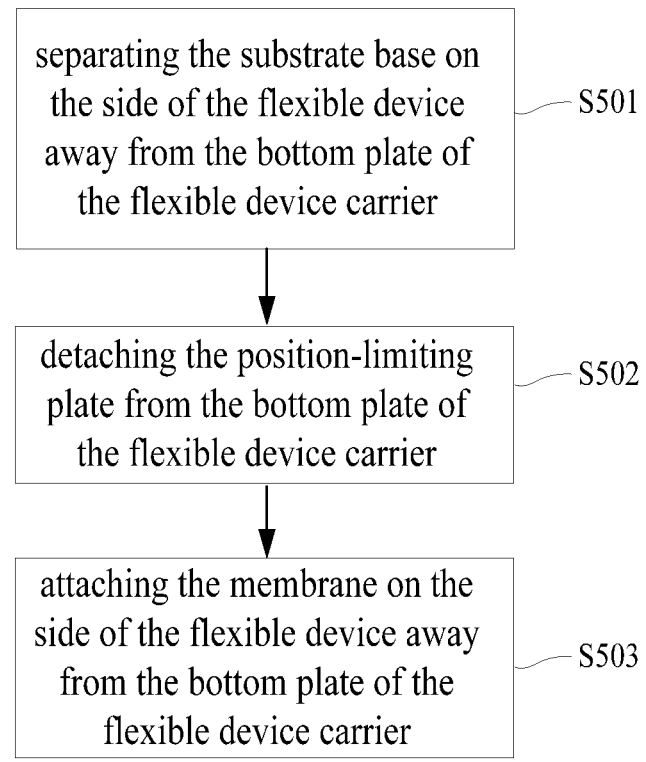
FIG. 5 shows a flowchart of a method for attaching a membrane on a flexible device in accordance with an embodiment of the present invention.

In another aspect, as shown in FIG. 5, an embodiment of the present invention provides a method for attaching a membrane on a flexible device supported by the flexible device carrier provided by any embodiment said above, comprising: step S501, separating and removing the substrate base attached on one side of the flexible device away from the bottom plate of the flexible device carrier; step S502, detaching the position-limiting plate from the bottom plate of the flexible device carrier; step S503, attaching the membrane on the side of the flexible device away from the bottom of the flexible device carrier.

With the method to attach the membrane on the flexible device, after detaching the position-limiting plate from the bottom plate of the flexible device carrier, the flexible device protrudes from the bottom plate, and the membrane can be directly attached on the side of the flexible device away from the bottom of the flexible device carrier, defects such as bubbles between the membrane and the flexible device due to the gap therebetween after attaching the membrane on the flexible device is reduced, and product yield of the flexible display panel is improved.

Specifically, as shown in FIG. 4d, in the step S503, the membrane may be attached on the side of the flexible device away from the flexible device carrier by a roller pressure process.

Obviously, the persons skilled in the art can make various variations and modifications without departing from the spirit and scope of the present invention, and these variations and modifications are also considered to be within the protection scope of the present invention if they belong to the range of claims of the present invention and the equivalent technologies thereof.

The invention claimed is:

1. A flexible device carrier for a flexible display panel, comprising:
    a bottom plate;
    a position-limiting plate provided opposite to the bottom plate and detachably mounted on the bottom plate through a position-limiting mechanism, wherein a slotted hole is provided on the position-limiting plate to match with one side of the bottom plate facing the position-limiting plate, so as to form a positioning groove for the flexible device.

2. The flexible device carrier of claim 1, wherein a vacuum suction hole is provided at a position on the bottom plate opposite to each slotted hole.

3. The flexible device carrier of claim 2, wherein the vacuum suction hole is a circular hole, and the circular hole has a diameter equal to or smaller than 1 mm.

4. The flexible device carrier of claim 3, wherein the position-limiting mechanism comprises:
    a slot provided on the bottom plate and a plug provided on the position-limiting plate, the plug is plugged in and matches with the slot; and/or,
    a slot provided on the position-limiting plate and a plug provided on the bottom plate, the plug is plugged in and match with the slot.

5. The flexible device carrier of claim 4, wherein four pairs of slots and plugs are provided, and connection lines between center points of projections of the four pairs of slots and plugs on the side of the bottom plate facing the position-limiting plate constitute a quadrilateral.

6. The flexible device carrier of claim 3, wherein the position-limiting mechanism comprises:
    a fastener provided on the bottom plate and a hook provided on the position-limiting plate, the fastener is clamped in and matches with the hook; and/or,
    a hook provided on the bottom plate and a fastener provided on the position-limiting plate, the fastener is clamped in and matches with the hook.

7. The flexible device carrier of claim 6, wherein both of the bottom plate and the position-limiting plate are of a quadrilateral shape, and at least one pair of sides of the bottom plate and the position-limiting plate are provided with the fastener and/or the hook thereon.

8. The flexible device carrier of claim 3, the position-limiting mechanism is of a mortise and tenon structure.

9. The flexible device carrier of claim 2, wherein the position-limiting mechanism comprises:
    a slot provided on the bottom plate and a plug provided on the position-limiting plate, the plug is plugged in and matches with the slot; and/or,
    a slot provided on the position-limiting plate and a plug provided on the bottom plate, the plug is plugged in and match with the slot.

10. The flexible device carrier of claim 9, wherein four pairs of slots and plugs are provided, and connection lines between center points of projections of the four pairs of slots and plugs on the side of the bottom plate facing the position-limiting plate constitute a quadrilateral.

11. The flexible device carrier of claim 2, wherein the position-limiting mechanism comprises:
    a fastener provided on the bottom plate and a hook provided on the position-limiting plate, the fastener is clamped in and matches with the hook; and/or, a hook provided on the bottom plate and a fastener provided on the position-limiting plate, the fastener is clamped in and matches with the hook.

12. The flexible device carrier of claim 11, wherein both of the bottom plate and the position-limiting plate are of a quadrilateral shape, and at least one pair of sides of the bottom plate and the position-limiting plate are provided with the fastener and/or the hook thereon.

13. The flexible device carrier of claim 2, the position-limiting mechanism is of a mortise and tenon structure.

14. The flexible device carrier of claim 1, wherein the position-limiting mechanism comprises:
   a slot provided on the bottom plate and a plug provided on the position-limiting plate, the plug is plugged in and matches with the slot; and/or,
   a slot provided on the position-limiting plate and a plug provided on the bottom plate, the plug is plugged in and match with the slot.

15. The flexible device carrier of claim 14, wherein four pairs of slots and plugs are provided, and connection lines between center points of projections of the four pairs of slots and plugs on the side of the bottom plate facing the position-limiting plate constitute a quadrilateral.

16. The flexible device carrier of claim 1, wherein the position-limiting mechanism comprises:
   a fastener provided on the bottom plate and a hook provided on the position-limiting plate, the fastener is clamped in and matches with the hook; and/or,
   a hook provided on the bottom plate and a fastener provided on the position-limiting plate, the fastener is clamped in and matches with the hook.

17. The flexible device carrier of claim 16, wherein both of the bottom plate and the position-limiting plate are of a quadrilateral shape, and at least one pair of sides of the bottom plate and the position-limiting plate are provided with the fastener and/or the hook thereon.

18. The flexible device carrier of claim 1, the position-limiting mechanism is of a mortise and tenon structure.

19. A method for attaching a membrane on a flexible device supported by the flexible device carrier of claim 1, comprising:
   separating and removing the substrate base attached on the side of the flexible device away from the bottom plate of the flexible device carrier;
   detaching the position-limiting plate from the bottom plate of the flexible device carrier;
   attaching the membrane on the side of the flexible device away from the bottom of the flexible device carrier.

20. The method of claim 19, wherein the step of attaching the membrane on the side of the flexible device away from the flexible device carrier comprises: attaching the membrane on the side of the flexible device away from the flexible device carrier by a roller pressure process.

\* \* \* \* \*